United States Patent
Lu et al.

(10) Patent No.: US 9,502,346 B2
(45) Date of Patent: Nov. 22, 2016

(54) INTEGRATED CIRCUIT WITH A SIDEWALL LAYER AND AN ULTRA-THICK METAL LAYER AND METHOD OF MAKING

(71) Applicant: TAIWAN SEMICONDUCTOR MANUFACTURING COMPANY, LTD., Hsinchu (TW)

(72) Inventors: Chih-Hung Lu, Zhudong Township (TW); Ching-Chen Hao, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 13/969,324

(22) Filed: Aug. 16, 2013

(65) Prior Publication Data

US 2015/0048516 A1 Feb. 19, 2015

(51) Int. Cl.
*H01L 23/522* (2006.01)
*H01L 21/768* (2006.01)
*H01L 23/532* (2006.01)

(52) U.S. Cl.
CPC ..... *H01L 23/5226* (2013.01); *H01L 21/76808* (2013.01); *H01L 21/76831* (2013.01); *H01L 23/5329* (2013.01); *H01L 23/53295* (2013.01); *H01L 2221/1031* (2013.01); *H01L 2924/0002* (2013.01)

(58) Field of Classification Search
CPC ............... H01L 21/76802; H01L 23/5226
USPC ......................................... 257/774
See application file for complete search history.

(56) References Cited

U.S. PATENT DOCUMENTS

| | | | |
|---|---|---|---|
| 6,111,319 A * | 8/2000 | Liou et al. ............. 257/758 |
| 2001/0049195 A1* | 12/2001 | Chooi ............ H01L 21/76801 438/687 |
| 2004/0147104 A1* | 7/2004 | Lin et al. ............. 438/598 |
| 2005/0093108 A1* | 5/2005 | Chang ............... 257/635 |
| 2005/0153544 A1* | 7/2005 | Suh et al. ............. 438/643 |
| 2006/0189137 A1* | 8/2006 | Anderson et al. ........ 438/691 |
| 2007/0190718 A1* | 8/2007 | Coolbaugh et al. ........ 438/253 |
| 2009/0243116 A1* | 10/2009 | Feustel ............ H01L 21/76807 257/773 |
| 2012/0080771 A1* | 4/2012 | Yang et al. ............. 257/532 |

* cited by examiner

*Primary Examiner* — Christine Enad
(74) *Attorney, Agent, or Firm* — Haynes and Boone, LLP

(57) ABSTRACT

An integrated circuit that includes a substrate, a metal layer over the substrate and a first dielectric layer over the metal layer. The first dielectric layer includes a via. A sidewall layer that includes a silicon compound is in the via. A second dielectric layer is over the sidewall layer and an ultra-thick metal (UTM) layer is in the via.

20 Claims, 9 Drawing Sheets

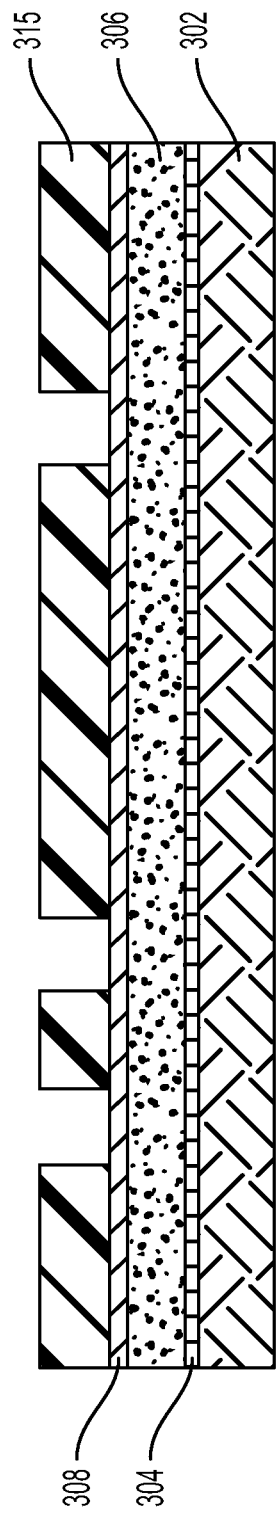

INTEGRATED CIRCUIT WITH A SIDEWALL LAYER AND AN ULTRA-THICK METAL LAYER AND METHOD OF MAKING

BACKGROUND

The semiconductor integrated circuit (IC) industry has produced a wide variety of devices to address issues in a number of different areas, including radio frequency (RF) communications. While growing in popularity, improving RF integrated circuits puts particular demands on the semiconductor process. Some RF circuits employ thick metal layers, even ultra-thick metal layers (UTM) for inductive and other properties. However, some traditional semiconductor processing techniques do not readily scale for use with UTM.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIGS. 3A-3G are cross-sectional views of an integrated circuit formed with a sidewall at various stages of production in accordance with one or more embodiments.

DETAILED DESCRIPTION

The following disclosure provides many different embodiments, or examples, for implementing different features of the invention. Specific examples of components and arrangements are described below to simplify the present disclosure. These are examples and are not intended to be limiting.

In some instances, semiconductor integrated circuit (IC) devices, such as radio frequency (RF) IC devices, include stacked metal layers. Some RF ICs employ both metal layers and ultra thick metal (UTM) layers in which the UTM layers have a greater thickness than the metal layers. For example, while some metal layers range from about 1,000 to about 8,000 angstroms (Å) in thickness, some UTM layers range from about 8,500 Å to about 38,000 Å in thickness. In some RF ICs, one or more UTM layers are formed over the metal layers separated by insulating layers except where portions of the metal and UTM layers are connected by one or more vias. Because of the greater thickness of UTM, traditional insulating layer etching methods used to pattern insulating layers to receive UTM also over-widen vias between metal layers and cause voids between vias to form. In some cases, voids between vias allow metal from a UTM layer to be unintentionally deposited into those voids. Deposition of UTM metal into vias and voids cause unspecified metal bridges to form between vias, thereby forming unintended conductive contacts between adjacent vias. Unintended conductive contacts can destroy the performance of the RF IC and correspondingly reduce yield of the RF IC fabrication process. In at least some embodiments, one or more of these problems are mitigated and/or obviated by fabrication of a sidewall in vias to mitigate or prevent the unintended etching. By mitigating or preventing unintended etching, the formation of unintended metal bridges is likewise mitigated or prevented, thereby improving yield of the IC fabrication process.

Figure 1A:
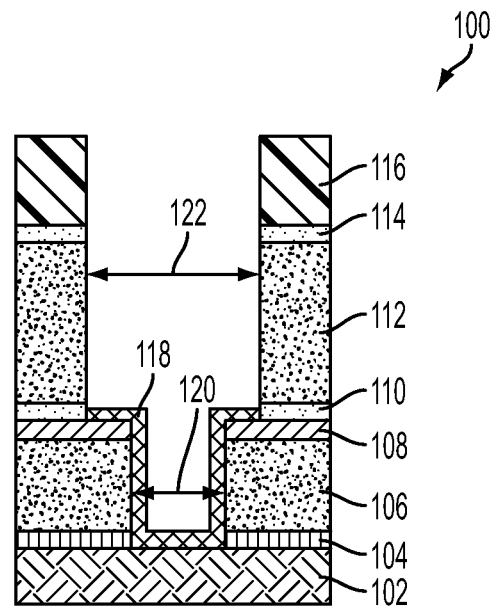
FIG. 1A is a cross-sectional view of an integrated circuit formed with a sidewall in accordance with one or more embodiments.

FIG. 1A is a cross-sectional view of an integrated circuit 100 formed with a sidewall in accordance with one or more embodiments. A metal layer 102 is over a substrate having one or more integrated circuits formed thereon. In some embodiments, the metal layer includes copper. In some embodiments, the metal layer includes aluminum, gold, silver and known alloys, some of which include copper. A first etch stop layer 104 is over the metal layer 102. In some embodiments, the first etch stop layer 102 includes silicon nitride (SiN) and silicon carbide (SiC). A first dielectric layer 106 is over the first etch stop layer 104. In some embodiments, the first dielectric layer 106 includes undoped silicate glass (USG). A second etch stop layer 108 is over the first dielectric layer 106. In some embodiments, the second etch stop layer 108 includes SiN and SiC. A third etch stop layer 110 is over the second etch stop layer 108. In some embodiments, the second etch stop layer 108 is combined with the third etch stop layer 110 over the first dielectric layer. A second dielectric layer 112 is over the third etch stop layer 110. In some embodiments, the second dielectric layer 112 includes USG. A fourth etch stop layer 114 is over the second dielectric layer 112. In some embodiments, the fourth etch stop layer 114 includes silicon oxynitride (SiON). A photoresist layer 116 is over the fourth etch stop layer 114.

As illustrated in FIG. 1A, a sidewall layer 118 is formed in a via 120 having a width between left and right portions of the first etch stop layer 104, left and right portions of the first dielectric layer 106 and left and right portions of the second etch stop layer 108. The via 120 ranges from about 0.07 micrometers (μm) to about 0.6 μm in width and ranges from about 1000 angstroms (Å) to about 8000 Å in height. The sidewall layer 118 also extends between left and right portions of the third etch stop layer 110. The sidewall layer 118 includes vertical portions in contact with metal layer 102, first etch stop layer 104, first dielectric layer 106 and second etch stop layer 108. The sidewall layer 118 also includes horizontal portions in contact with metal layer 102, first etch stop layer 104, second etch stop layer 108 and third etch stop layer 110. As described below, in some embodiments the sidewall layer 118 include SiN, SiC, or an oxygen-rich silicon (Si) compound that includes carbon (C), oxygen (O), hydrogen (H) or fluorine (F), such as SiCOH, porous SiCOH, $SiO_2$, SiOF, SiCOF and related compounds. One or more etching processes on integrated circuit 100 create a gap 122 having a width between left and right portions of the third etch stop layer 110, left and right portions of the second dielectric layer 112, and left and right portions of the fourth etch stop layer 110, corresponding to a pattern in the photoresist 116. The gap 122 ranges from about 1.5 micrometers (μm) to about 15 μm in width and ranges from about 8500 angstroms (Å) to about 38000 Å in height. As etching is performed on integrated circuit 100, the sidewall layer 118 mitigates or prevents etching of the first etch stop layer 104, the first dielectric layer 106, the second etch stop layer 108 and the third etch stop layer 110. In some embodiments, the third etch stop layer 110 includes the sidewall layer 118.

Figure 1B:
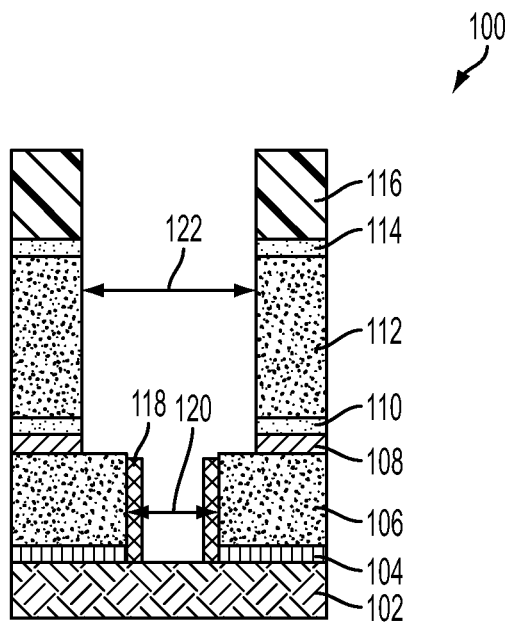
FIG. 1B is a cross-sectional view of the integrated circuit formed with a sidewall, the sidewall being partially removed after etching, in accordance with one or more embodiments.

FIG. 1B is a cross-sectional view of the integrated circuit 100 formed with a sidewall, the sidewall being partially removed after etching, in accordance with one or more embodiments. Etching performed on integrated circuit 100 in FIG. 1A removed material from layers 104-114. The sidewall layer 118 mitigated or prevented unspecified etching of first etch stop layer 104, first dielectric layer 106, second etch stop layer 108 and third etch stop layer 110. As illustrated in FIG. 1B, vertical portions of the sidewall layer 118 remain or substantially remain and horizontal portions of the sidewall layer are removed. The via 120 and the gap 122 are ready to receive an ultra thick metal (UTM) layer to electrically couple portions of the metal layer 102 to portions of the UTM layer. Although the IC 100 was etched to form the via 120 and the gap 122, the sidewall layer 118 mitigated or prevented both unintended widening of the via 120 and the formation of one or more voids in layers 104-110, thereby preventing unspecified metal bridges from forming in such voids between vias.

Figure 2:
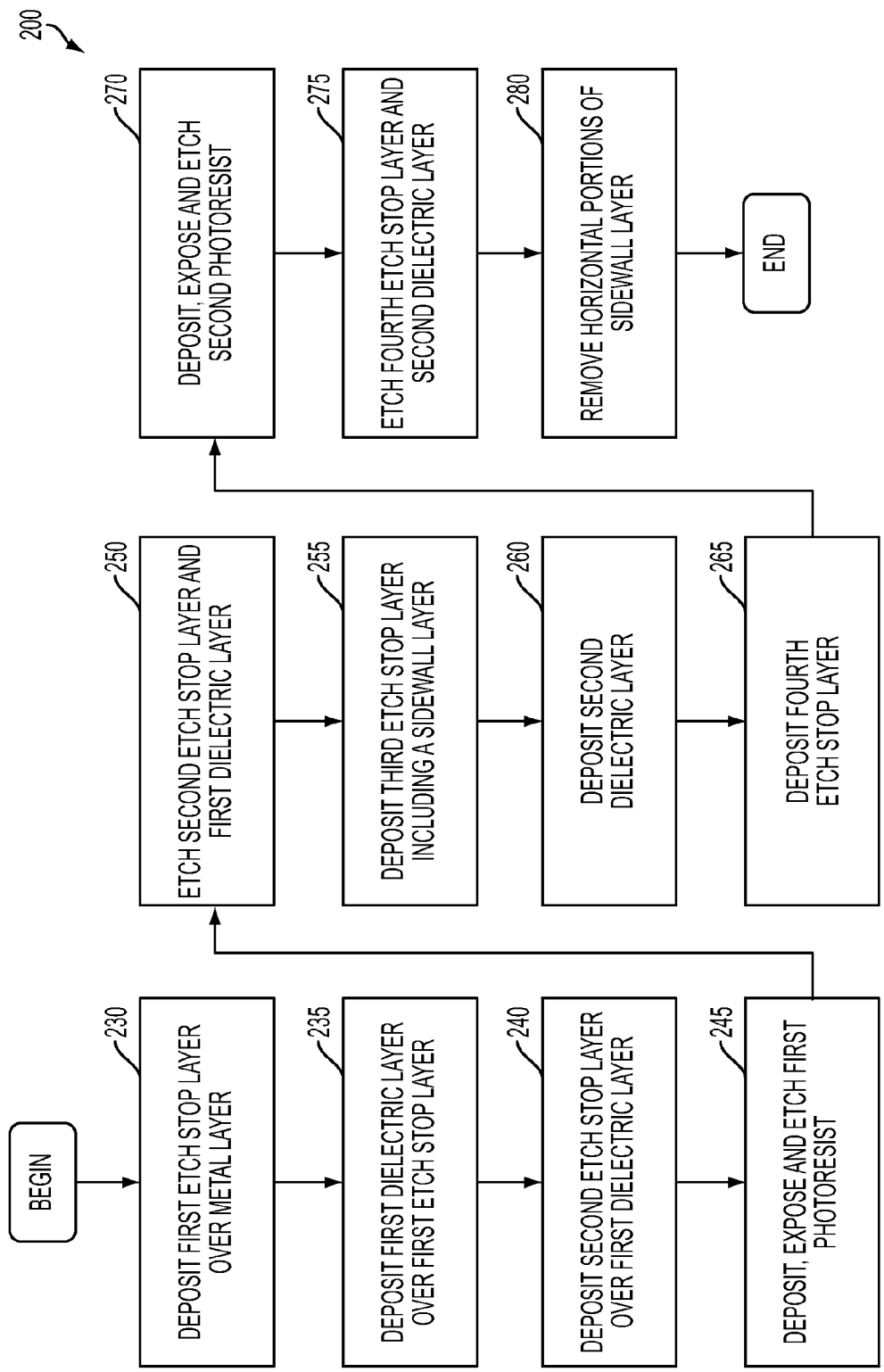
FIG. 2 is a flow chart of a method of making an integrated circuit formed with a sidewall in accordance with one or more embodiments.

FIG. 2 is a flow chart of a method 200 of making an integrated circuit formed with a sidewall in accordance with one or more embodiments. It is understood that additional processes are not precluded from being performed before, during, and/or after the method 200 depicted in FIG. 2.

In operation 230, a first etch stop layer is formed over a metal layer, the metal layer being formed over a substrate of an integrated circuit. The first etch stop layer includes silicon nitride (SiN) and silicon carbide (SiC). In some embodiments, the second etch stop layer comprises SiN, SiC, silicon oxynitride (SiON), fluoride-doped silicate glass (FSG), a low dielectric constant (low-K) dielectric material, other suitable materials, and/or combinations thereof. In some embodiments, the first etch stop layer comprises a tensile etch stop layer and/or a compressive etch stop layer. In some embodiments, the first etch stop layer is formed by converting an upper portion of a buffer layer into the first etch stop layer. For example, carbon atoms are implanted onto the buffer layer by performing ion implantation or plasma assisted implantation. In some embodiments, the first etch stop layer is deposited or grown on the buffer layer by performing atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof. In yet some other embodiments, the first etch stop layer is deposited or grown over the buffer layer or, if the buffer layer is omitted, over the metal layer and the substrate.

In operation 235, a first dielectric layer is formed over the first etch stop layer. The first dielectric layer includes undoped silicate glass (USG). In some embodiments, the first dielectric layer comprises phosphorous-doped silicate glass (PSG), phosphorus-doped tetraethoxy silane (PTEOS), boron-phosphosilicate tetraethoxy silane (BPTEOS), spin-on-glass (SOG), other suitable materials, or combinations thereof. In some embodiments, the dielectric layer is formed by performing ALD, CVD, wet oxidation, PVD, RPCVD, PECVD, MOCVD, sputtering, plating, other suitable processes, and/or combinations thereof.

In operation 240, a second etch stop layer is formed over the first dielectric layer. Similar to the first etch stop layer, the second etch stop layer includes SiN and SiC. In some embodiments, the second etch stop layer comprises SiN, SiC, silicon oxynitride (SiON), fluoride-doped silicate glass (FSG), a low dielectric constant (low-K) dielectric material, other suitable materials, and/or combinations thereof. In some embodiments, the second etch stop layer is formed by performing ALD, CVD, wet oxidation, PVD, RPCVD, PECVD, MOCVD, sputtering, plating, other suitable processes, and/or combinations thereof. In some embodiments, the second etch stop layer comprises a tensile etch stop layer and/or a compressive etch stop layer.

In operation 245, a first photoresist layer is deposited over the third etch stop layer. The first photoresist layer is exposed with electromagnetic radiation, such as ultraviolet (UV) light, through a mask pattern by a photolithography process. The exposed first photoresist layer is etched to form a pattern corresponding to the mask pattern. In some embodiments the unexposed first photoresist layer is etched to form a pattern corresponding to the mask pattern. In some embodiments the first photoresist layer includes a polymeric material, such as a negative photoresist based on an acrylic polymer.

FIG. 3A is a cross-sectional view of an integrated circuit formed with a sidewall following operations 230-245 in accordance with one or more embodiments. The integrated circuit 300 includes a metal layer 302 over a substrate having one or more circuits formed thereon. A first etch stop layer 304 is over the metal layer 302. A first dielectric layer 306 is over the first etch stop layer 304. A second etch stop layer 306 is over the first dielectric layer 306. A photoresist layer 315 is over the second etch stop layer. The photoresist layer has been exposed to electromagnetic radiation and is partially removed to form a photolithography pattern.

Returning to FIG. 2, in operation 250, an etch process (such as a dry etch process, a wet etch process, or a plasma etch process) is performed to form an opening in the second etch stop layer and the first dielectric layer using the first etch stop layer to stopping etching for this operation. In some embodiments, the etching process is performed by using source gases $CH_2F_2$ and/or $CHF_3$ together with Nitrogen, Argon, and/or Helium. In another embodiment, an etching chemical, such as $C_4F_6$ and/or $C_4F_8$, together with $CF_4$ plasma source gases are used for performing the etching process.

Figure 3B:
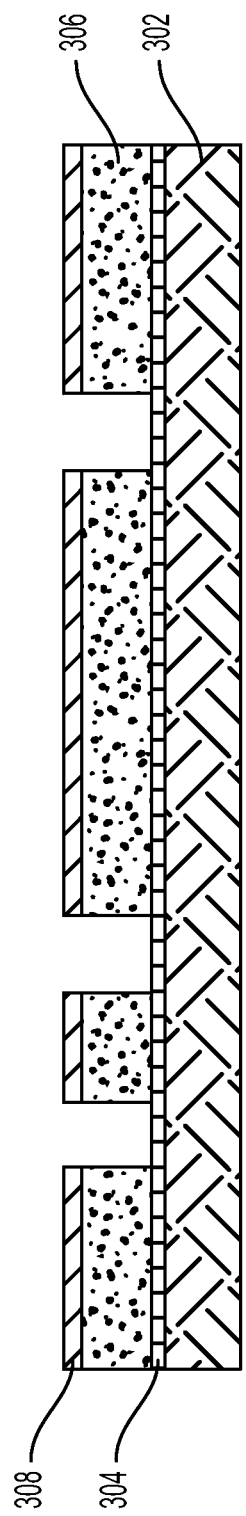

FIG. 3B is a cross-sectional view of an integrated circuit formed with a sidewall following operations 250 in accordance with one or more embodiments. Both the second etch stop layer 306 and the first dielectric layer 306 have had portions removed by etching. The photoresist 315 has also been removed after etching.

Returning to FIG. 2, in operation 255, a third etch stop layer including a sidewall layer is deposited over the second etch stop layer. The sidewall layer includes SiN and SiC (SiN/SiC) as an etch stop component, and an oxygen-rich Si compound such as SiCOH, porous SiCOH, $SiO_2$, SiOF, SiCOF and related compounds as a sacrificial component. The etch stop component and sacrificial component are deposited sequentially to form the sidewall layer, however, in some embodiments the etch stop component and sacrificial component are deposited together. In some embodiments only the etch stop component or the sacrificial component are deposited, but not both. The sidewall layer is deposited by ALD. In some embodiments, the sidewall layer is formed by performing CVD, wet oxidation, PVD, RPCVD, PECVD, MOCVD, sputtering, plating, other suitable processes, and/or combinations thereof. In some embodiments, the sidewall layer comprises a tensile etch stop layer and/or a compressive etch stop layer. The SiN/SiC etch stop component of the sidewall is deposited in a layer between about 200 Å and about 700 Å thick. In some embodiments the sidewall is deposited in a layer about 500 Å thick.

Figure 3C:
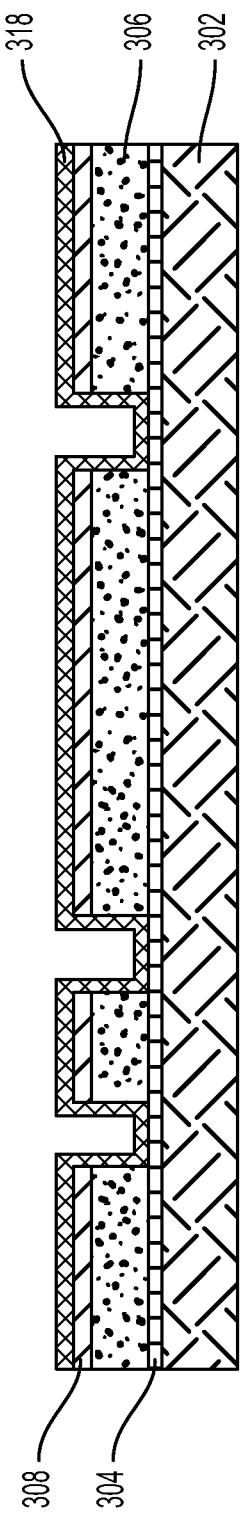

FIG. 3C is a cross-sectional view of an integrated circuit formed with a sidewall following operation 255 in accordance with one or more embodiments. A sidewall layer 318 is deposited on the integrated circuit. Horizontal portions of the sidewall layer 318 are deposited over the first etch stop layer 304 and the second etch stop layer 308. Vertical portions of the sidewall layer 318 are adjacent to the first dielectric layer 306 and the second etch stop layer 308.

Returning to FIG. 2, in operation 260, a second dielectric layer is deposited over the sidewall layer. The second dielectric layer includes USG. In some embodiments, the dielectric layer comprises PSG, PTEOS, BPTEOS, SOG, other suitable materials, or combinations thereof. In some embodiments, the dielectric layer is formed by performing ALD, CVD, wet oxidation, PVD, RPCVD, PECVD, MOCVD, sputtering, plating, other suitable processes, and/or combinations thereof.

In operation 265, a fourth etch stop layer 114 is deposited over the second dielectric layer. The fourth etch stop layer includes silicon oxynitride (SiON). In some embodiments, the fourth etch stop layer includes silicon oxide, silicon nitride, fluoride-doped silicate glass (FSG), a low dielectric constant (low-K) dielectric material, other suitable materials, and/or combinations thereof. In some embodiments, the second etch stop layer is formed by performing ALD, CVD, wet oxidation, PVD, RPCVD, PECVD, MOCVD, sputtering, plating, other suitable processes, and/or combinations thereof. In some embodiments, the second etch stop layer comprises a tensile etch stop layer and/or a compressive etch stop layer.

Figure 3D:
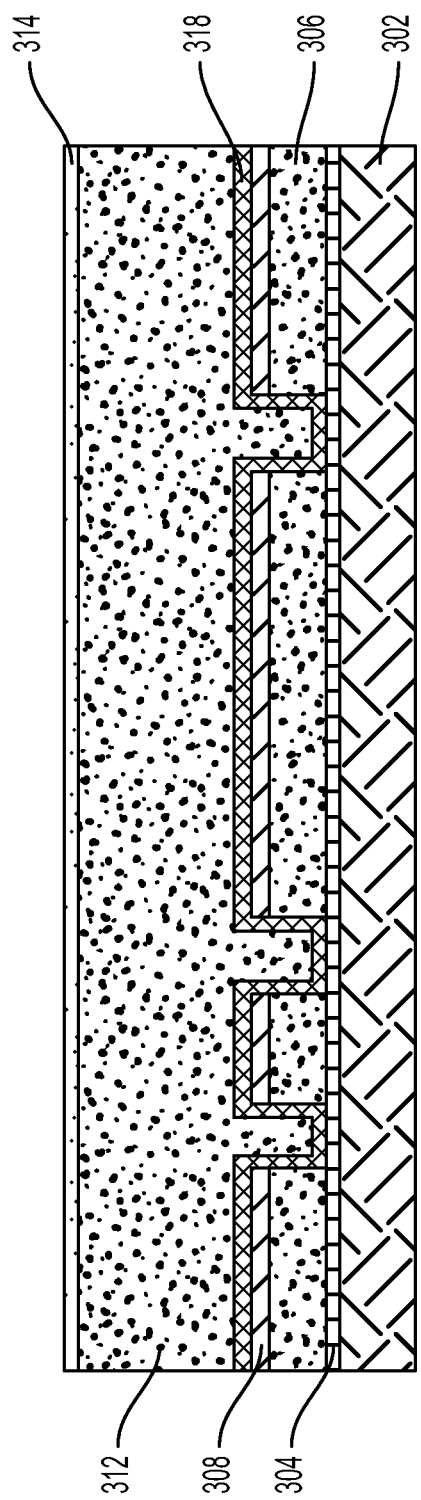

FIG. 3D is a cross-sectional view of an integrated circuit formed with a sidewall following operations 260 and 265 in accordance with one or more embodiments. The integrated circuit includes a second dielectric layer 312 deposited over the sidewall layer 318. A fourth etch stop layer 314 is deposited over the second dielectric layer 312.

In operation 270, a second photoresist layer is deposited over the fourth etch stop layer. The first photoresist layer is exposed with electromagnetic radiation, such as ultraviolet (UV) light, through a mask pattern by a photolithography process. The exposed second photoresist layer is etched to form a pattern corresponding to the mask pattern. In some embodiments the unexposed second photoresist layer is etched to form a pattern corresponding to the mask pattern. In some embodiments the second photoresist layer includes a polymeric material, such as a negative photoresist based on an acrylic polymer.

Figure 3E:
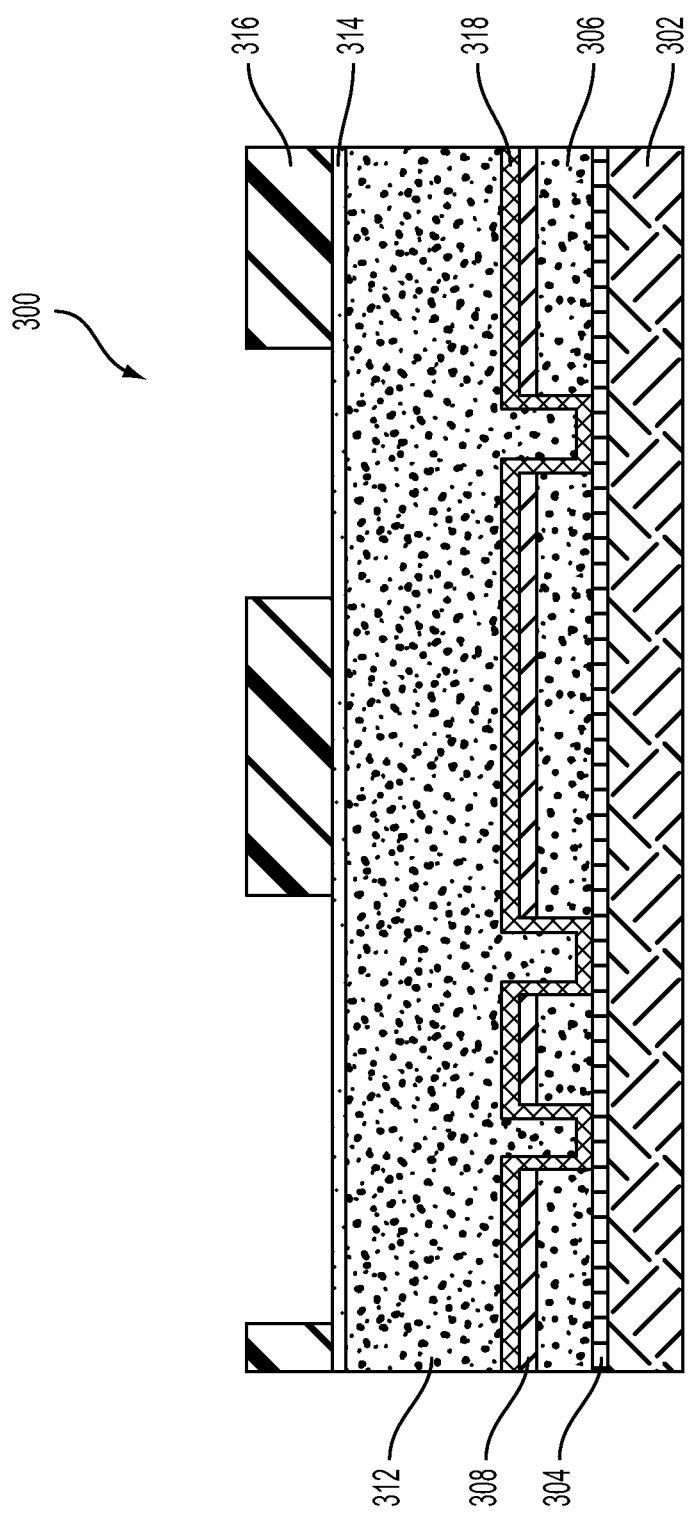

FIG. 3E is a cross-sectional view of an integrated circuit formed with a sidewall following operation 270 in accordance with one or more embodiments. The integrated circuit includes a photoresist layer 316 is over the second etch stop layer 314. The photoresist layer 316 has been exposed to electromagnetic radiation and is partially removed to form a photolithography pattern.

Returning to FIG. 2, in operation 275, an etch process (such as a dry etch process, a wet etch process, or a plasma etch process) is performed to form an opening in the fourth etch stop layer and the second dielectric layer using the sidewall layer to mitigate or prevent further etching for this operation. In some embodiments, the etching process is performed by using source gases $CH_2F_2$ and/or $CHF_3$ together with Nitrogen, Argon, and/or Helium. In another embodiment, an etching chemical, such as $C_4F_6$ and/or $C_4F_8$, together with $CF_4$ plasma source gases are used for performing the etching process.

Figure 3F:
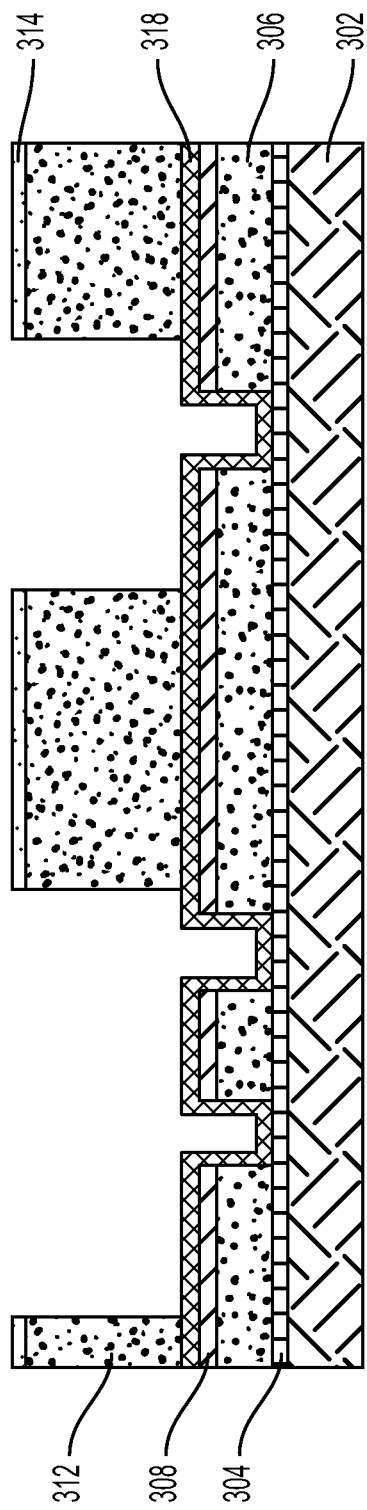

FIG. 3F is a cross-sectional view of an integrated circuit formed with a sidewall following operation 275 in accordance with one or more embodiments. Both the fourth etch stop layer 314 and the second dielectric layer 312 have had portions removed by etching. The photoresist 316 has also been removed after etching.

Returning to FIG. 2, in operation 280, an etch process (such as a dry etch process, a wet etch process, or a plasma etch process) is performed to form an opening in the sidewall layer exposing the metal layer. In some embodiments, the etching process is performed by using source gases $CH_2F_2$ and/or $CHF_3$ together with Nitrogen, Argon, and/or Helium. In another embodiment, an etching chemical, such as $C_4F_6$ and/or $C_4F_8$, together with $CF_4$ plasma source gases are used for performing the etching process.

Figure 3G:
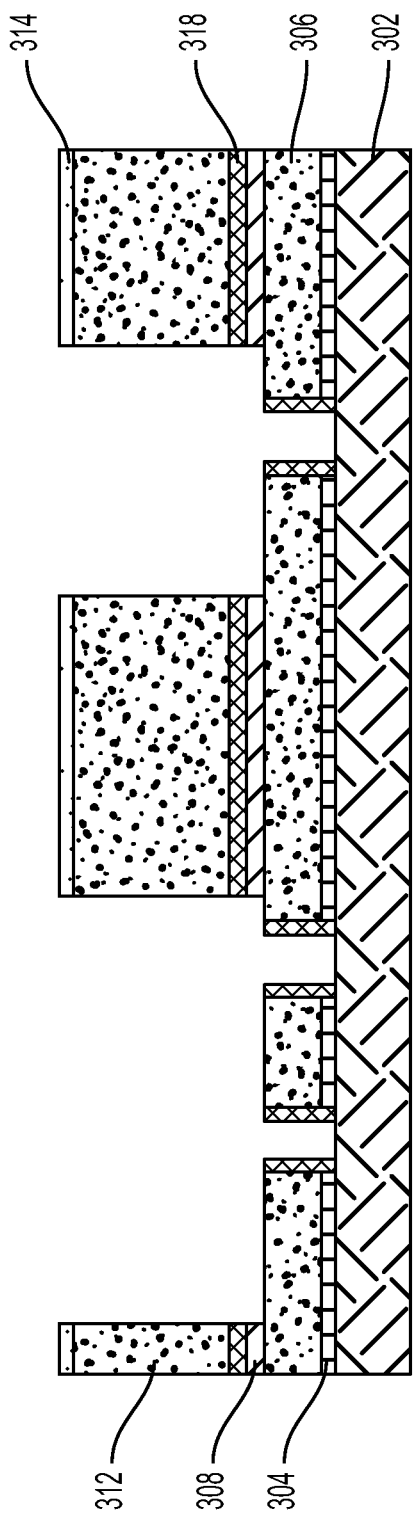

FIG. 3G is a cross-sectional view of an integrated circuit formed with a sidewall following operation 280 in accordance with one or more embodiments. Horizontal portions of the sidewall layer 318 and first etch stop layer 304 have been removed by etching to exposed the metal layer 302. Openings in the sidewall layer 318 to the metal layer are vias through which an ultra-thick metal (UTM) layer is deposited. Deposition of a UTM layer in vias through the sidewall layer 318 to the metal layer 302 enables a conductive contact to be made between the metal layer 302 and the UTM layer. Vertical portions of the sidewall layer 318 are not intentionally removed to provide some continuing protection to the remaining first etch stop layer and first dielectric layer. In some embodiments the vertical portions of the sidewall layer 318 also protect portions of the second etch stop layer. The sidewall layer 318 protected portions of the integrated circuit from over-etching during the process described in detail above, mitigating or preventing over-etching of the vias and the creation of unintended voids in areas capable of receiving the UTM layer.

One aspect of this description relates to a method of making an integrated circuit. The method includes forming a metal layer over a substrate, forming a first dielectric layer over the metal layer, forming a via in the first dielectric layer by removing a portion of the dielectric layer, forming a sidewall layer in the via, forming a second dielectric layer over the sidewall layer, removing a portion of the second dielectric layer, and forming an ultra-thick metal (UTM) layer in the via, the UTM layer being thicker than the metal layer.

Another aspect of this description relates to a method of making an integrated circuit. The method includes forming a metal layer over a substrate, forming a first etch stop layer over the metal layer, forming a first dielectric layer over the first etch stop layer, forming a second etch stop layer over the first dielectric layer, forming a first photoresist layer over the second etch stop layer, forming a pattern in the first photoresist layer, forming a pattern in the first dielectric layer and the second etch stop layer corresponding to the pattern in the first photoresist layer, wherein the pattern includes a via having sidewalls, forming a third etch stop layer comprising a sidewall layer in the via having a sidewall, the sidewall layer having a vertical portion adjacent to the sidewall, the sidewall layer having a horizontal portion over the second etch stop layer, forming a second dielectric layer over the third etch stop layer, forming a fourth etch stop layer over the second dielectric layer, forming a second photoresist layer over the fourth etch stop layer, forming a pattern in the second photoresist layer, forming a pattern in the second dielectric layer and the fourth etch stop layer corresponding to the pattern in the second photoresist layer, wherein the pattern exposes the sidewall layer in the via, removing horizontal portions of the sidewall layer and portions of the first etch stop layer to expose the metal layer, and forming an ultra-thick metal (UTM) layer in the via and over the first dielectric layer, the UTM layer being thicker than the metal layer.

The integrated circuit includes a substrate and a metal layer on the substrate. The transistor further includes a first dielectric layer over the metal layer, the first dielectric layer having a via, a sidewall layer in the via, a second dielectric layer over the sidewall layer, the second dielectric layer having a gap over the via, and an ultra-thick metal (UTM) layer in the via and the gap, the UTM layer being thicker than the metal layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit, comprising:
   a metal layer over a substrate;
   a first etch stop layer over the metal layer, wherein the first etch stop layer has a first composition;
   a first dielectric layer over the metal layer, the first dielectric layer having a via;
   a second etch stop layer on a top surface of the first dielectric layer;
   a sidewall layer having a first portion disposed on a first sidewall of the via and a second portion disposed on a top surface of the second etch stop layer, wherein the first and second portion are non-contiguous, the sidewall layer comprising a silicon compound, and wherein the sidewall layer has a second composition, the first composition having a different etch selectivity than the second composition, wherein the second portion of the sidewall layer has a bottom surface that directly interfaces the second etch stop layer;
   a second dielectric layer directly over the second portion of the sidewall layer, such that a top surface of the second portion of the sidewall layer, the top surface opposing the bottom surface, directly interfaces a bottom surface of the second dielectric layer, the bottom surface of the second dielectric layer being parallel a top surface of the substrate; and
   an ultra-thick metal (UTM) layer in the via, the UTM layer being thicker than the metal layer.

2. The integrated circuit of claim 1, wherein the sidewall layer includes silicon nitride (SiN).

3. The integrated circuit of claim 1, wherein the sidewall layer includes silicon carbide (SiC).

4. The integrated circuit of claim 1, wherein the sidewall layer includes an oxygen-rich Si compound selected from SiCOH, porous SiCOH, SiOF, or SiCOF.

5. The integrated circuit of claim 1, wherein the first etch stop layer is between the metal layer and the first dielectric layer.

6. The integrated circuit of claim 5, wherein the first etch stop layer includes a material selected from SiN, SiC, silicon oxynitride (SiON), fluoride-doped silicate glass (FSG) or a low dielectric constant (low-K) dielectric material.

7. The integrated circuit of claim 1, wherein the second etch stop layer includes a material selected from SiN, SiC, silicon oxynitride (SiON), fluoride-doped silicate glass (FSG) or a low dielectric constant (low-K) dielectric material.

8. The integrated circuit of claim 1, wherein the sidewall layer directly abuts the first sidewall of the via.

9. The integrated circuit of claim 1, wherein the via ranges from about 0.07 micrometers (μm) to about 0.6 μm in width.

10. The integrated circuit of claim 1, wherein the via ranges from about 1000 angstroms (Å) to about 8000 Å in height.

11. The integrated circuit of claim 1, further comprising:
    a gap in the second dielectric layer above the via, wherein the gap ranges from about 1.5 micrometers (μm) to about 15 μm in width and ranges from about 8500 Å to 38000 Å in height.

12. The integrated circuit of claim 1, wherein the first portion of the sidewall layer directly interfaces a top surface of the metal layer.

13. An integrated circuit, comprising:
    a metal layer over a substrate;
    a first etch stop layer over the metal layer;
    a first dielectric layer over the metal layer;
    a via having a first width extending through the first dielectric layer and the first etch stop layer;
    a second etch stop layer over the first dielectric layer;
    a third etch stop layer directly on the second etch stop layer and over the first dielectric layer;
    a second dielectric layer over the second and third etch stop layers;
    a gap having a second width extending through the second dielectric layer and the third etch stop layer, wherein the second width is greater than the first width and wherein the gap and the via provide a contiguous opening;
    a sidewall layer on a first sidewall and opposing second sidewall of the via, the sidewall layer comprising a silicon compound and the sidewall layer has a material with a different etch selectivity than a material of the first etch stop layer, and wherein an uppermost surface of the sidewall layer is below the second dielectric layer such that the sidewall layer is not disposed in the gap; and
    an ultra-thick metal (UTM) layer in the opening comprising the via and the gap, the UTM layer being thicker than the metal layer.

14. The integrated circuit of claim 13, wherein the silicon compound includes a material selected from silicon nitride (SiN), silicon carbide (SiC), SiCOH, porous SiCOH, SiO2, SiOF or SiCOF.

15. The integrated circuit of claim 13, wherein the gap having the second width extends through the second etch stop layer.

16. An integrated circuit, comprising:
    a metal layer over the substrate;
    a first etch stop layer over the metal layer;
    a first dielectric layer over the metal layer, the first dielectric layer having a via including a via sidewall;
    a sidewall layer comprising:
        a silicon compound composition;
        a vertical portion having a top surface, wherein the top surface of the vertical portion is below a top surface of a second etch stop layer disposed on the first dielectric layer, the vertical portion is adjacent to the via sidewall, and the vertical portion is within the via, wherein the vertical portion of the sidewall layer is in direct contact with the metal layer; and a horizontal portion above the first dielectric layer and being spaced a distance from the vertical portion and directly on the top surface of the second etch stop layer;

the second etch stop layer and a third etch stop layer over the first etch stop layer;

a second dielectric layer over the second etch stop layer;

a gap over the via, wherein a sidewall of the gap is defined by the second etch stop layer, the horizontal portion of the sidewall layer, the second dielectric layer, and the third etch stop layer; and an ultra-thick metal (UTM) layer in the via and the gap, the UTM layer being thicker than the metal layer.

17. The integrated circuit of claim 16, wherein the vertical portion of the sidewall layer is in contact with the first dielectric layer.

18. The integrated circuit of claim 16, wherein the first etch stop layer is between the metal layer and the first dielectric layer.

19. The integrated circuit of claim 18, wherein the second etch stop layer is over the first dielectric layer; and the third etch stop layer is over the second dielectric layer.

20. The integrated circuit of claim 16, wherein the third etch stop layer is disposed directly on the second etch stop layer.

* * * * *